United States Patent
Hsu

(10) Patent No.: US 7,302,126 B2
(45) Date of Patent: Nov. 27, 2007

(54) CIRCUIT BOARD STRUCTURE OF INTEGRATED OPTOELECTRONIC COMPONENET

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 11/510,462

(22) Filed: Aug. 24, 2006

(65) Prior Publication Data

US 2007/0086696 A1   Apr. 19, 2007

(30) Foreign Application Priority Data

Oct. 17, 2005   (TW) ............................... 94136111 A

(51) Int. Cl.
*G02B 6/12* (2006.01)

(52) U.S. Cl. ......................................... 385/14; 385/131

(58) Field of Classification Search .................. 385/14, 385/129–132, 49, 50, 89
See application file for complete search history.

(56) References Cited

U.S. PATENT DOCUMENTS 6,839,476 B2   1/2005  Kim et al.
7,024,086 B2 *  4/2006  Tourne ......................... 385/131
2005/0185880 A1 *  8/2005  Asai ............................. 385/14
2006/0228068 A1 * 10/2006  Ouchi .......................... 385/14

* cited by examiner

*Primary Examiner*—Hemang Sanghavi
(74) *Attorney, Agent, or Firm*—Sawyer Law Group LLP

(57) ABSTRACT

A circuit board structure of integrated optoelectronic components is composed of: a carrying board with at least one through opening; a first optoelectronic component accommodated in the through opening, which has an active surface and a non-active surface. A dielectric layer, a circuit layer and build-up layers are successively formed on the active surface of the optoelectronic component and the carrying board. A first opening penetrates the dielectric layer and the circuit layer while a second opening penetrates the build-up layers. The present invention provides that the circuit layer is directly formed on the surface of the first optoelectronic component so that the registration between the circuit layer and the electrode pads of the optoelectronic component is improved. Moreover, the optical transmission component for transmitting signal is integrated in the build-up circuit layer. Thus, the cost is reduced, the production is improved and the volume is shrunken.

19 Claims, 3 Drawing Sheets

CIRCUIT BOARD STRUCTURE OF INTEGRATED OPTOELECTRONIC COMPONENET

CROSS-REFERENCE TO RELATED APPLICATIONS

This application claims benefit under 35 USC 119 of Taiwan Application No. 094136111, filed on Oct. 17, 2005.

FIELD OF THE INVENTION

The present invention relates to circuit board structures of integrated optoelectronic component, and more particularly, to a circuit board structure that has been integrated with optoelectronic component, optical transmission component, and circuit structure.

BACKGROUND OF THE INVENTION

As the technological development of semiconductors advances, demands for miniaturized packaging and larger data storage capacity have also intensified along the way. In addition to that, because the data processing capacity is constantly increasing, if data units of the same size can be processed at the fastest speed possible in a given unit of time, then data can be processed more efficiently. The most straightforward method for raising the processing speed of semiconductors is to increase its usage frequency, but when clock rates more then Gb/s, problems like power dissipation, signal time delay, and electromagnetic interference (EMI) also arise, which will impede the production of semiconductors with high performance. This problem has been made even more severe because the traditional medium for data signal transfer is copper circuit, which cannot achieve higher conductivity due to its intrinsically limited conducting property, thus its signal transmission speed cannot be elevated by the method of increasing its conductivity.

Moreover, the signal transmission structure made of metal circuits is more susceptible to the interference of external noises or internal circuits during signal transmitting, which in turn leads to erroneous signals being transferred. Therefore, the signal transmitting structure has to be equipped with adequate protective measures to prevent the interference mentioned above from affecting signals, and this phenomenon is especially obvious in high-frequency application. The protective measures will result in increased difficulty to the designs of circuit and additional structures, which will in turn raise the costs of design and production, and cannot improve the current situation.

The traditional method of signal transmitting is analog signal transmission, which works by charging conductor with electrical currents, but the current method for processing signals inside circuits is the digital processing method, which can easily distort signals when one type of signal is converted to the other during signal transfer.

In order to resolve the disadvantages resulted from the traditional method of analog signal transmission, the new technology uses optical signal to replace electrical signal for signal transmission, and the most palpable advantage by such change is better quality in signal transmission, since the optical signal is almost unsusceptible to interference of electromagnetic waves and is thus not distorted as much. As a result, there is no need to design a structure for preventing the interference of electromagnetic waves, and this helps reduce the costs of design and production. Therefore, using optical signal for signal transmission has become the main aim for future development.

In the prior arts, the optical signal transmission requires signal processing components such as optical fibers, optical connectors, optical/electrical converters, and electrical/optical converters for digital data transfer to proceed, but optical alignment system of high precision is large in size and hence can hamper the developmental trend of miniaturization.

FIG. 1 is a cross-sectional view showing the circuit board of U.S. Pat. No. 6,839,476, which utilizes optical fibers for signal transmission; wherein a core layer 12 is formed on the bottom layer 11, and a plurality of grooves 12a are formed on the core layer 12; an optical fiber 13 is placed into the groove 12a, then a top layer 14 is formed on core layer 12, so that optical fiber 13 is embedded inside core layer 12, and optical fiber 13 is made by enclosing a layer of cladding 13b around a core 13a. Optical transmitting and receiving modules or passive optical components can be disposed on both ends of optical fiber 13, by which allows optical fiber 13 to transfer optical signals, and thus avoiding the disadvantages resulted from electrical signal transfer.

However, because optical fiber 13 needs to be embedded in groove 12a of core layer 12, the core layer 12 has to undergo the grooving process in prior to the above step, followed by the disposition of optical fiber 13 into groove 12a to complete the overall production process. But the disposition of optical fiber 13 into groove 12a is carried out mechanically, in other words, the method of mechanical insertion is employed to insert electronic components into circuit board in prior arts. As a result, the speed of production is slower and cannot reach the goal of fast production.

Moreover, optical fiber 13 needs to be cut in accordance with the length of groove 12a that it faces beforehand, so that it can then be fit into groove 12a; this adds an additional step in the overall production process, and hence raises the difficulty of the production process. On the other hand, the uneven length of optical fiber 13 also makes the classification step in the production process more complicated, thereby increasing overall production steps and raising its complication, and in turn results in increased production costs.

Because grooves 12a has to be formed on core layer 12 in order to accept optical fiber 13, it is necessary to leave adequate interval spaces between each of the groove 12a while designing their size, so that optical fiber 13 can be fixed inside core layer 12. But under the double influences of the size of interval space and the diameter of optical fiber 13, the wiring density cannot be increased further.

Furthermore, the optical fiber 13 used to transfer optical signal is made by enclosing a layer of cladding 13b around a core 13a, wherein the inner layer of cladding 13b can serve as a reflective surface that allows the optical signals to be reflected forwardly and thereby achieving the goal of transmitting signals. However, optical fiber 13 and circuit board are two different structures and need to be made independently; afterwards, the two separately made products also have to be integrated. Both steps described above increase the difficulty of the overall production process as well as impede the attainment of mass production, and thus the production costs cannot be lowered further.

When precise alignment is carried out by the use of optical connector with optical fiber, the high precision aligning equipment is also required for the transfer of optical signal to proceed due to the lower performance of automatic production. In addition, it is also necessary to carry out aligning by manual labor, which leads to increased production costs and reduced productivity.

In addition, the semiconductor package of the prior arts is made by forming grooves inside it before implanting optical fibers, so it is necessary to leave adequate interval spaces between each of the groove while designing their size, so that optical fibers can be fixed inside the semiconductor package. But under the double influences of the size of interval space and the diameter of optical fiber, the wiring density cannot be further elevated, which also leads to more complicated and difficult production process, along with increased production costs.

Therefore, the most urgent issue for the industry is to provide an electronic device that can meet the demand of miniaturization and reduce loss of signal during signal transmitting, shorten conductivity pathway, and decrease noises; a circuit board integrated with optoelectronic components that can elevate signal transfer quality, increase registration, simplify production process, lower production costs, raise wiring density and productivity should also be provided.

SUMMARY OF THE INVENTION

In light of the drawbacks of the prior arts described above, the main objective of the present invention is to provide a circuit board structure of integrated optoelectronic components that can meet the demand of miniaturization for electronic devices.

Another objective of the present invention is to provide a circuit board structure of integrated optoelectronic components that can reduce signal loss during signal transfer, shorten conductivity pathway, decrease noises and elevate the quality of signal transfer.

Another objective of the present invention is to provide a circuit board structure of integrated optoelectronic components that can improve the alignment of optoelectronic component.

A further objective of the present invention is to provide a circuit board structure of integrated optoelectronic components that can simplify production process.

To achieve the above and other objectives, the present invention discloses a circuit board structure of integrated optoelectronic components, which is consisted of: a carrying board that has at least one opening; at least a first optoelectronic component that is disposed in the opening of the carrying board, and the first optoelectronic component has an active surface and a non-active surface opposite to the active surface, the active surface also has a plurality of electrode pads and optical active areas; a dielectric layer that is formed on the surface of the carrying board and the active surface of the first optoelectronic component, and a plurality of openings are formed in the dielectric layer to expose the electrode pads of the first optoelectronic component; a circuit layer that is formed on the surface of the dielectric layer, the circuit layer also forms conductive structures in the openings of the dielectric layer and electrically connects to the electrode pads of the first optoelectronic component; at least a build-up circuit layer structure that is formed on the surface of the dielectric layer that has a circuit layer, and it is electrically connected to the circuit layer; a first opening that penetrates the dielectric layer and the build-up circuit layer structure and a second opening that penetrates the build-up circuit layer structure, wherein the first opening is facing the optical active area on the active surface of the first optoelectronic component; as well as at least an optical transmission component that is embedded within the build-up circuit layer structure, one of the transmission ends of the optical transmission component is facing and exposed through the first opening, and is opposite to the optical active area of the first optoelectronic component, whereas the other transmission end is facing and exposed through the second opening.

An insulating layer is formed on the outer surface of the build-up circuit layer structure described above, and it has a plurality of openings to expose the parts of circuit layer on the outer surface of the build-up circuit layer structure that serve as electrical connecting pads. A second optoelectronic component is formed on top of the electrical connecting pads and electrically connected to them, and the optical active area on the active surface of the second optoelectronic component is facing and exposed through the second opening, it is also opposite to the other transmission end of the optical transmission component.

Moreover, the circuit board structure of integrated optoelectronic components of the present invention is further comprised of a heat dissipation board formed on the bottom surface of the carrying board.

Therefore, in the circuit board structure of integrated optoelectronic components of the present invention, at least a first optoelectronic component is embedded in the opening of the carrying board, then a dielectric layer, a circuit layer and build-up circuit layer structure are successively formed on the carrying board and the active surface of the first optoelectronic component, and a first opening that penetrates the dielectric layer and the build-up circuit layer structure is formed, while a second opening that penetrates the build-up circuit layer structure is also formed. At least an optical transmission component is embedded in the build-up circuit layer structure, and one of the transmission ends of the optical transmission component is facing and exposed through the first opening, so that it is opposite to the optical active area on the active surface of the optoelectronic component, thereby forming a circuit board structure of integrated optoelectronic components that is also embedded with at least an optoelectronic component and an optical transmission component. Because the circuit layer is electrically connected to the electrode pads of the first optoelectronic component directly, the alignment between the circuit and the first optoelectronic component is improved, thereby simplifying the production and increasing productivity.

In addition to that, optical transmission components are embedded into build-up circuit layer structure in the present invention, as a result, there is no need to form grooves for the disposition of optical transmission component in the circuit board structure of integrated optoelectronic components. Thus the optical transmission component can be directly embedded in the dielectric layer of build-up circuit layer structure during the formation of the build-up circuit layer structure, which also allows the production to be simplified and thereby reducing the production costs.

Additionally, the first optoelectronic component and the optical transmission component are embedded in the carrying board and build-up circuit layer structure respectively in the present invention. As a result, the size of product packaging is reduced and this enables the demand of miniaturization for electronic devices to be satisfied. On the other hand, problems like signal loss during signal transfer and occurrence of noises can also be reduced, and conductivity pathway can also be shortened, which leads to the improvement of the quality of signal transfer.

Furthermore, according to the present invention, the outer surface of the build-up circuit layer structure can be disposed with at least a second optoelectronic component. With regard to the optical active area on the active surface of the first optoelectronic component that is embedded in the carrying board, and the optical active area on the active surface of the second optoelectronic component that is disposed on the outer surface of the build-up circuit layer structure; both are facing the two transmission ends of the optical transmission component that is embedded under the build-up circuit layer structure. As a result, the signals of the first and the second optoelectronic components can be transmitted through the optical transmission component, thereby forming a modularized circuit board structure that is also integrated with optoelectronic components, which can satisfy the constantly rising demands regarding the quality of electronic products.

In addition, the bottom surface of the carrying board can be further disposed with a heat dissipation board, so that the heat produced from running the optoelectronic components embedded within the carrying board can be effectively dispelled by the heat dissipation board. Therefore, the reliability of the optoelectronic components is ensured and their durability can be extended.

BRIEF DESCRIPTION OF THE DRAWINGS

The present invention can be more fully comprehended by reading the detailed description of the embodiments listed below, with reference made to the accompanying drawings, wherein.

DETAILED DESCRIPTION OF THE INVENTION

The present invention relates generally to a circuit board structure that has been integrated with optoelectronic component, optical transmission component, and circuit structure. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiments shown, but is to be accorded the widest scope consistent with the principles and features described herein.

The invention has been described using exemplary embodiments; anyone who is familiar with the arts can easily comprehend other advantages and effects of the present invention by reading the disclosed content in this claim. Moreover, the present invention can also be implemented or applied by using other embodiments, and anyone can modify and adjust the details in this claim on the basis of different considerations or applications, provided that he or she does not depart from the purpose and scope of the present invention.

Figure 1:
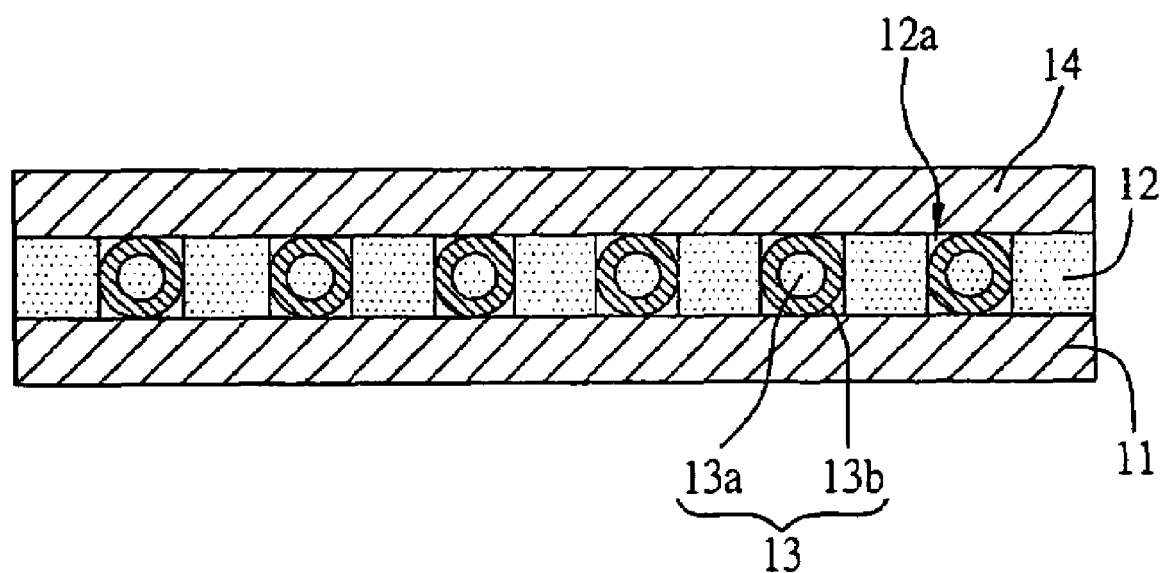
FIG. 1 is a cross-sectional view showing the invention of U.S. Pat. No. 6,839,476.
Figure 2A:
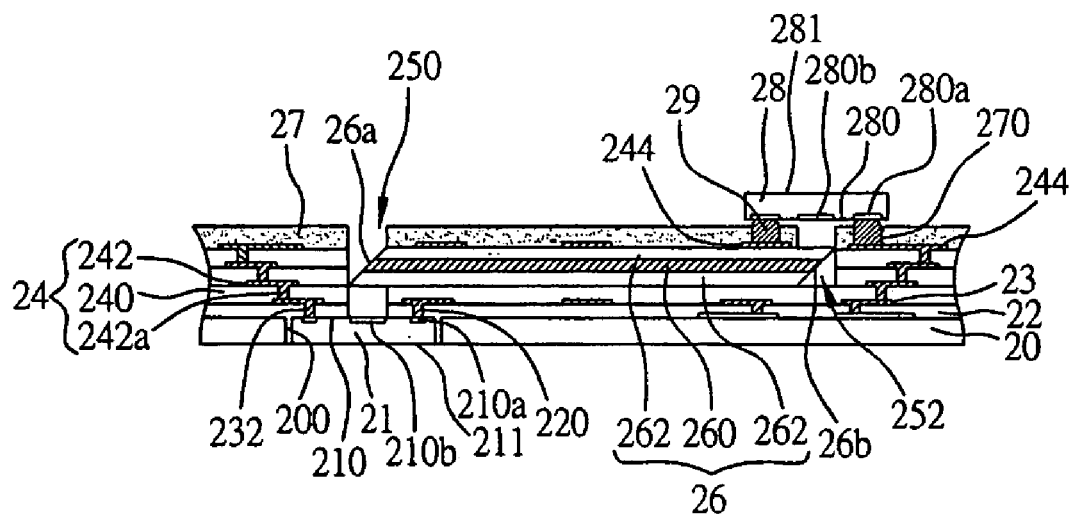
FIGS. 2A and 2B are schematic cross-sectional views illustrating the circuit board structure of integrated optoelectronic components according to the first embodiment of the present invention.

Referring to FIG. 2A, which depicts the schematic cross-sectional view of the circuit board structure of integrated optoelectronic components in accordance with the first embodiment of the present invention.

As indicated in the figure, the circuit board structure of integrated optoelectronic components is composed of: a carrying board 20 that has at least one through opening 200; a first optoelectronic component 21 that has at least an active surface 210 and a non-active surface 211 opposite to the active surface, and it is located in opening 200 of carrying board 20; a dielectric layer 22 that is formed on the surface of carrying board 20 and on active surface 210 of first optoelectronic component 21; a circuit layer 23 that is formed on the surface of dielectric layer 22 and electrically connected to first optoelectronic component 21; at least a build-up circuit layer structure 24 that is formed on the surface of dielectric layer 22 that has circuit layer 23, and is electrically connected to circuit layer 23; a first opening 250 that penetrates dielectric layer 22 and build-up circuit layer structure 24, and a second opening 252 that penetrates build-up circuit layer structure 24; as well as at least an optical transmission component 26 that is embedded in build-up circuit layer structure 24. For the purpose of simplifying the explanatory details and figures, the exemplary figure that only shows the formation of one opening 200 in carrying board 20 for the disposition of a first optoelectronic component 21 is provided, but it is not to be used to limit the scope of the present invention.

The carrying board 20 described above can either be a metal board, a ceramic board, an insulating board, a printed circuit board, an organic substrate, or the randomly stacked structure made of the previous mentioned materials. The organic substrate can either be a printed circuit board or an IC package substrate.

The first optoelectronic component 21 has an active surface 210 and a non-active surface 211 opposite to the active surface, and a plurality of electrode pads 210a and optical active areas 210b are disposed on the active surface 210. The first optoelectronic component 21 is located in opening 200 of the carrying board. In this embodiment, the first optoelectronic component 21 is either an active optical component or a passive optical component, and the active optical component can either be LD (laser diode), LED (light emitting diode), or VCSEL (vertical cavity surface emitting laser), whereas the passive optical component can either be LED or photosensitive components.

The dielectric layer 22 is formed on the surface of carrying board 20 and on active surface 210 of first optoelectronic component 21, wherein dielectric layer 22 has a plurality of holes 220 to expose electrode pads 210a on the active surface of first optoelectronic component 21. The dielectric layer 22 can either be made of organic dielectric materials that can be applied as a thin film or liquid organic resin materials, and these materials can be photosensitive or non-photosensitive organic resins made of either ABF (Ajinomoto Build-up Film), BCB (Benzocyclo-buthene), LCP (Liquid Crystal Polymer), PI (Poly-imide), PPE (Poly(phenylene ether)), PTFE (Poly(tetra-fluoroethylene), FR4, FR5, BT (Bismaleimide Triazine), Aimide or Aramide; or it can be constituted by mixing materials like epoxy resin and glass fiber.

The circuit layer 23 is formed on the surface of dielectric layer 22, and by the conductive via 232 formed in hole 220 of dielectric layer 22; circuit layer 23 can electrically connect to electrode pad 210a of first optoelectronic component 21.

The build-up circuit layer structure 24 is formed on the surface of dielectric layer 22 that has a circuit layer 23, and is electrically connected to this circuit layer 23. The build-up circuit layer structure 24 is consisted of: a dielectric layer 240; a circuit layer 242 that is stacked upon dielectric layer 240; as well as a conductive via-like conductive structure 242a, which penetrates dielectric layer 240 so that circuit layer 242 is electrically connected to circuit layer 23.

A first opening 250 penetrates both dielectric layer 22 and built-up circuit layer structure 24, while a second opening 252 penetrates build-up circuit layer structure 24; the first opening 250 is located on top of optical active area 210b of the first optoelectronic component 21, so that optical active area 210b of the first optoelectronic component 21 is exposed. The first opening 250 and the second opening 252 can either be hollow or filled with optical transmitting materials, so that the optical transmitting and receiving components can be protected and thus the transfer of optical signal is facilitated.

The optical transmission component 26 is embedded in build-up circuit layer structure 24, and is constituted of a core layer 260 and a cladding layer 262 that encloses around the core layer 260. The optical transmission component 26 has two transmission ends 26a and 26b, both transmission ends, 26a and 26b, have at least a reflective surface, and transmission ends 26a and 26b are facing and exposed through the first opening 250 and the second opening 252 respectively. The transmission end 26a is opposite to optical active area 210b of the first optoelectronic component 21.

An additional insulating layer 27 can be formed on the outer surface of the build-up circuit layer structure 24 described above, a plurality of holes 270 can also be formed in insulating layer 27 to expose the parts of build-up circuit layer structure 24 that serve as electrical connecting pads 244.

In addition to that, the circuit board structure of integrated optoelectronic components above is further comprised of a second optoelectronic component 28, which has an active surface 280 and a non-active surface 281 opposite to the active surface; the active surface 280 has a plurality of electrode pads 280a and optical active areas 280b, and is connected to the electrical connecting pads 244 of holes 270 in insulating layer 27 by conductive component 29, which is a solder bump. The optical active area 280b on active surface 280 of the second optoelectronic component 28 is facing the second opening 252, and is opposite to transmission end 26b of optical transmission component 26. In other words, the first optoelectronic component 21 and the second optoelectronic component 28 are aligned to the first opening 250 and the second opening 252 respectively, so that the signals of the first and the second optoelectronic components 21 and 28 can be directly transmitted through optical transmission component 26. As a result, the signal transfer pathway is shortened, the signal loss is reduced, and the wiring density of the circuit board structure is elevated, thereby improving the electrical functionality of the circuit board structure.

Figure 2B:
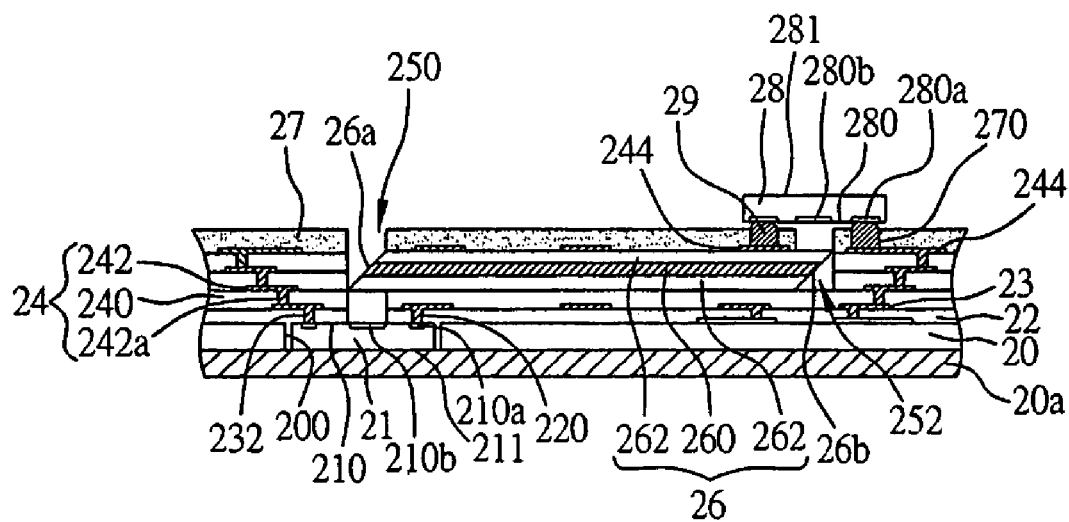

Referring to FIG. 2B, which is another embodiment of the present invention, wherein the bottom surface of carrying board 20 can be disposed with a supporting board 20a. The supporting board 20a can either be a metal board, a ceramic board, an insulating board, a printed circuit board, an organic substrate, or the randomly stacked structure made of the previous materials. The organic substrate can either be a printed circuit board or an IC package substrate. As a result, the heat engendered from running the optoelectronic components can be efficiently dissipated, and the electrical functionality of the circuit board structure can be improved.

Figure 3:
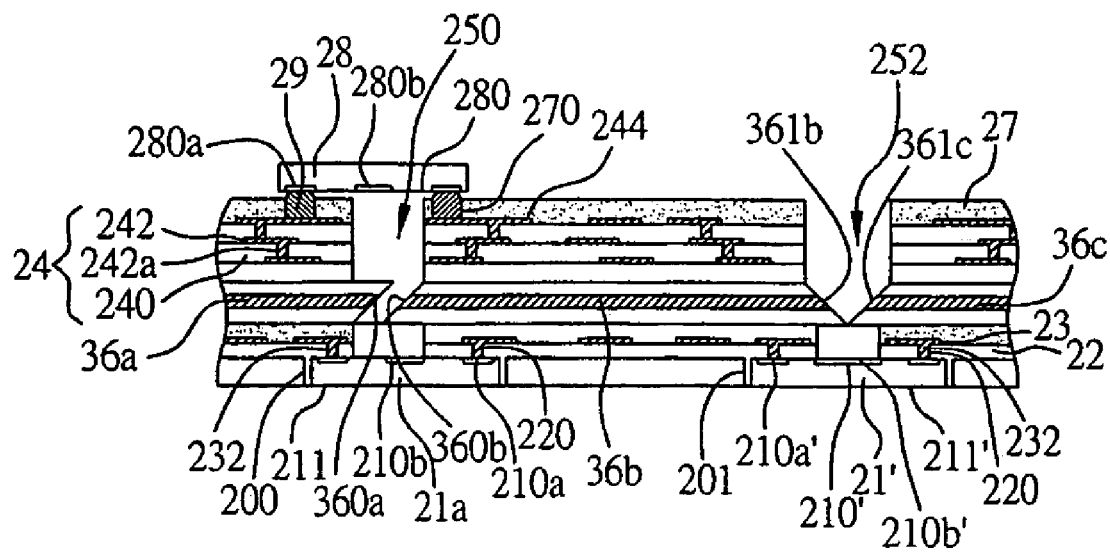
FIG. 3 is a schematic cross-sectional view depicting the circuit board structure of integrated optoelectronic components according to the second embodiment of the present invention.

FIG. 3 shows the schematic cross-sectional view of the circuit board structure of integrated optoelectronic components, in accordance with the second embodiment of the present invention.

The circuit board structure of integrated optoelectronic components in this embodiment is approximately the same to the one in the first embodiment, the main differences are that the structure in this embodiment is further comprised of optical transmission components of various types of alignment, and a plurality of first optoelectronic components are disposed in the carrying board; a build-up circuit layer structure is also formed on the circuit board structure that has been embedded with optical transmission components.

Again referring to FIG. 3, the structure it indicates is composed of: the carrying board 20, a plurality of first optoelectronic components 21 and 21', the dielectric layer 22, the circuit layer 23, the build-up circuit layer structure 24, the first and the second openings 250 and 252 that penetrate dielectric layer 22 and build-up circuit layer structure 24, and a plurality of optical transmission components 36a, 36b, and 36c that are embedded in build-up circuit layer structure 24.

The above carrying board 20 has a plurality of through openings 200 and 201, and the first optoelectronic components 21 and 21' are disposed in openings 200 and 201 of carrying board 20 respectively. The first optoelectronic components can have optoelectronic components with different electrical functionality. Each of the first optoelectronic components 21 and 21' have an active surface 210 and 210', and a non-active surface 211 and 211' opposite to the active surface. The active surfaces 210 and 210' have a plurality of electrode pads 210a and 210a', and optical active areas 210b and 210b' respectively.

As described previously, the dielectric layer 22, the circuit layer 23, and the build-up circuit layer structure 24 are formed on the surface of carrying board 20 and on active surfaces 210 and 210' of the first optoelectronic components 21 and 21', the first and the second openings 250 and 252 are also formed in dielectric layer 22 and build-up circuit layer structure 24, so that optical active areas 210b and 210b' of the first optoelectronic components 21 and 21' are exposed. A plurality of optical transmission components 36a, 36b, and 36c are embedded underneath build-up circuit layer structure 24, and transmission ends 360a and 360b of optical transmission components 36a and 36b are located in the first opening 250, wherein the transmission end 360b is opposite to optical active area 210b of the first optoelectronic component 21. The transmission ends 361b and 361c of optical transmission components 36b and 36c are located in the second opening 252, and are opposite to optical active area 210b' of the first optoelectronic component 21'.

An insulating layer 27 can be formed on the outer surface of build-up circuit layer structure 24, and a plurality of holes 270 are formed in insulating layer 27 to expose the parts of circuit layer on the outer surface of build-up circuit layer structure 24 that serve as electrical connecting pads 244; the electrical connecting pads 244 are electrically connected to the second optoelectronic component 28 by conductive components, so that the second optoelectronic component 28 is disposed on top of the first opening 250 and is opposite to transmission end 360a of optical transmission component 36a. A circuit board structure that has been integrated with a number of optoelectronic components and a number of optical transmission components is completed at this stage. In other words, a modularized package structure of optoelectronic components is resulted, which in turn elevates the overall electrical functionality of the circuit board structure.

An additional supporting board (not shown in the figure) can be formed on the bottom surface of carrying board 20, and the supporting board 20a can either be a metal board, a ceramic board, an insulating board, a printed circuit board, an organic substrate, or the randomly stacked structure made of the previous materials. The organic substrate can either be a printed circuit board or an IC package substrate. As a result, the heat engendered from running the optoelectronic components can be efficiently dissipated, and the electrical functionality of the circuit board structure can be improved.

Figure 4:
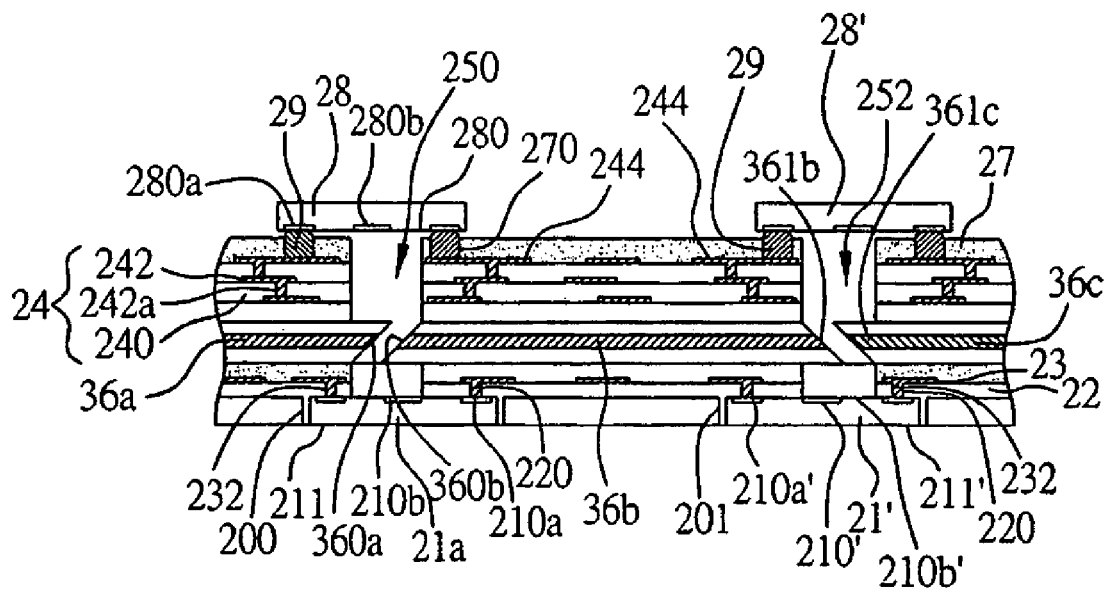
FIG. 4 is a schematic cross-sectional view depicting the circuit board structure of integrated optoelectronic components according to the third embodiment of the present invention.

Referring to FIG. 4, which illustrates the schematic cross-sectional view of the circuit board structure of integrated optoelectronic components in accordance with the third embodiment of the present invention.

The circuit board structure of integrated optoelectronic components in this embodiment is approximately the same to the one in the first embodiment, the main differences are that the structure in this embodiment is further comprised of optical transmission components of various types of alignment, and a plurality of first optoelectronic components are disposed on the surface of the circuit board.

As shown in the figure, a plurality of through openings 200 and 201 of carrying board 20 are connected to the first optoelectronic components 21 and 21', wherein the first optoelectronic components can have varied electrical functionality. The dielectric layer 22, the circuit layer 23, and the build-up circuit layer structure 24 are successfully formed on the surface of carrying board 20 and on the active surfaces 210 and 210' of the first optoelectronic component 21, and the first and the second openings 250 and 252 are formed in dielectric layer 22 and build-up circuit layer structure 24 to expose optical active areas 210b and 210b' of first optoelectronic components 21 and 21'. A plurality of optical transmission components 36a, 36b, and 36c are embedded underneath build-up circuit layer structure 24, and the transmission ends 360a and 360b of optical transmission components 36a and 36b are located in the first opening 250, wherein transmission end 360b is opposite to optical active area 210b of the first optoelectronic component 21; the transmission ends 361b and 361c of optical transmission components 36b and 36c are located in the second opening 252, wherein transmission end 361b of optical transmission component 36b is opposite to optical active area 210b' of another first optoelectronic component 21'.

An additional insulating layer 27 can be formed on the outer surface of the build-up circuit layer structure 24 described above, the insulating layer 27 also has a plurality of holes 270, so that the parts of circuit layer on the outer surface of the build-up circuit layer structure 24 that serve as electrical connecting pads 244 are exposed.

In addition, the conductive component 29 are added on top of electrical connecting pads 244 in order to electrically connect electrical connecting pads 244 to the second optoelectronic components 28 and 28', so that the second optoelectronic components 28 and 28' are disposed upon the first and the second openings 250 and 252 respectively, thereby making transmission ends 360a and 361c of optical transmission components 36a and 36c align to the second optoelectronic components 28 and 28' respectively. As a result, many different optoelectronic components and optical transmission components can be integrated into a circuit board structure, which also gives rise to a modularized package structure of optoelectronic components that can elevate the overall electrical functionality of the circuit board structure. In the circuit board structure described above, the second optoelectronic components can have varied electrical functionality, and an additional supporting board (not shown in the figure) can be connected to the bottom surface of carrying board 20, the supporting board 20a can either be a metal board, a ceramic board, an insulating board, a printed circuit board, an organic substrate, or the structure made by stacking a combination of the previous materials together. The organic substrate can either be a printed circuit board or an IC package substrate. As a result, the heat engendered from running the optoelectronic components can be efficiently dissipated, and the electrical functionality of the circuit board structure can be improved.

Therefore, in the circuit board structure of integrated optoelectronic components of the present invention, at least a first optoelectronic component is embedded in the opening of the carrying board, then a dielectric layer, a circuit layer, and build-up circuit layer structures are successively formed on the carrying board the active surface of the optoelectronic component, a plurality of first and second openings are formed and they penetrate the dielectric layer and the build-up circuit layer structures. At least an optical transmission component is also formed in the build-up circuit layer structures, and one of the transmission ends of the optical transmission component is located in the first opening and is opposite to the optical active area on the active surface of the first optoelectronic component, thereby forming a circuit board structure of integrated optoelectronic components embedded with at least one optoelectronic component and one optical transmission component. The present invention provides that the circuit layer is electrically connected to the electrode pads of the optoelectronic component directly; as a result, the alignment between the circuit and the electrode pads of the optoelectronic component is improved.

In addition, according to the present invention, the optical transmission components are embedded underneath the build-up circuit layer structure. In other words, it is not necessary to separately form the groove for fitting the optical transmission component, and the optical transmission component can be directly embedded underneath the dielectric layer of the build-up circuit layer structure during the process of making the build-up circuit layer structure. Hence the production process can be simplified and the production costs can be reduced.

Moreover, in the circuit board structure of integrated optoelectronic components of the present invention, the optoelectronic component and the optical transmission component are embedded inside it, and thus the package size of the product can be reduced to meet the demand of miniaturization for electronic devices. By integrating the optoelectronic components, problems like signal loss during signal transfer, overlong conductivity pathway, and the occurrence of noises can be mitigated significantly, thereby improving the quality of signal transfer.

Furthermore, at least an additional second optoelectronic component can be formed on the outer surface of the build-up circuit layer structure in the present invention, so that the first optoelectronic component embedded in the carrying board can transmit its signal through the optical transmission component formed under the build-up circuit layer structure. As a result, a modularized circuit board structure is formed, which can satisfy the constantly rising demands regarding the quality of electronic products.

Besides, in accordance with the present invention, the bottom surface of the carrying board can be further disposed with a heat dissipation board, so that the heat produced from running the first optoelectronic components embedded in the carrying board can be effectively dispelled by the heat dissipation board. As a result, the reliability of the optoelectronic components is ensured and their durability can be extended.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit board structure of integrated optoelectronic components, comprising:
   a carrying board that has at least an opening;
   at least an first optoelectronic component that is disposed in the opening of the carrying board, the first optoelectronic component has an active surface and a non-active surface opposite to the active surface, and the active surface has a plurality of electrode pads and optical active areas;
   a dielectric layer that is formed on the carrying board and on the active surface of the first optoelectronic component, an opening is also formed in the dielectric layer to expose the optical active area of the first optoelectronic component, whereas a plurality of holes are formed in the dielectric layer to expose the electrode pads of the first optoelectronic component;
   a circuit layer that is formed on the surface of the dielectric layer; the circuit layer forms the conductive structure in the hole of dielectric layer and is electrically connected to the electrode pads of the first optoelectronic component;
   build-up circuit layer structure(s), which is formed on the surface of the dielectric layer and is electrically connected to the circuit layer;
   a first opening, which penetrates the dielectric layer and the build-up circuit layer structure, wherein the first opening is opposite to the optical active area on the active surface of the first optoelectronic component;
   a second opening, which penetrates the build-up circuit layer structure; and
   at least an optical transmission component, which is embedded underneath the build-up circuit layer structure; one of the transmission ends of the optical transmission component is located in the first opening, and is opposite to the optical active area of the first optoelectronic component.

2. The circuit board structure of integrated optoelectronic components of claim 1, wherein the build-up circuit layer structure is composed of the dielectric layer, the circuit layer stacked on top of the dielectric layer, and the conductive structure formed in the dielectric layer.

3. The circuit board structure of integrated optoelectronic components of claim 1, wherein an additional insulating layer is formed on the outer surface of the build-up circuit layer structure, and the insulating layer has a plurality of holes to expose the parts of circuit layer on the outer surface of the build-up circuit layer structure that serve as electrical connecting pads.

4. The circuit board structure of integrated optoelectronic components of claim 3, further comprising at least a second optoelectronic component; the second optoelectronic component has an active surface and a non-active surface opposite to the active surface, and the active surface has a plurality of electrode pads and optical active areas. The second optoelectronic component is disposed on the electrical connecting pads on the outer surface of the build-up circuit layer structure, and the optical active area on the active surface of the second optoelectronic component is facing either the first opening or the second opening, and thus it is opposite to one of the transmission ends of the optical transmission component.

5. The circuit board structure of integrated optoelectronic components of claim 1, wherein the transmission ends of the optical transmission component have at least one reflective surface.

6. The circuit board structure of integrated optoelectronic components of claim 1, wherein the optical transmission component is consisted of a core layer and a layer of cladding enclosing around the surface of the core layer.

7. The circuit board structure of integrated optoelectronic components of claim 1, wherein the carrying board can either be a metal board, a ceramic board, an insulating board, a printed circuit board, an organic substrate, or the structure made by stacking a combination of the previous materials together.

8. The circuit board structure of integrated optoelectronic components of claim 7, wherein the organic substrate can either be a printed circuit board or an IC package substrate.

9. The circuit board structure of integrated optoelectronic components of claim 1, further comprising a supporting board that is formed on the bottom surface of the carrying board.

10. The circuit board structure of integrated optoelectronic components of claim 9, wherein the supporting board can either be a metal board, a ceramic board, an insulating board, a printed circuit board, an organic substrate, or the structure made by stacking a combination of the previous materials together.

11. The circuit board structure of integrated optoelectronic components of claim 10, wherein the organic substrate can either be a printed circuit board or an IC package substrate.

12. The circuit board structure of integrated optoelectronic components of claim 1, wherein the first optoelectronic component includes either an active optical component or a passive optical component.

13. The circuit board structure of integrated optoelectronic components of claim 4, wherein the second optoelectronic component is opposite to either the active optical component or the passive optical component of the first optoelectronic component.

14. The circuit board structure of integrated optoelectronic components of claim 12, wherein the active optical component can either be LD, LED, or VCSEL.

15. The circuit board structure of integrated optoelectronic components of claim 12, wherein the passive optical component can either be LED or a photosensitive component.

16. The circuit board structure of integrated optoelectronic components of claim 1, wherein another first optoelectronic component is disposed in the other opening of the carrying board.

17. The circuit board structure of integrated optoelectronic components of claim 16, wherein the second opening penetrates the dielectric layer and is facing and exposing the optical active area on the active surface of another first optoelectronic component.

18. The circuit board structure of integrated optoelectronic components of claim 1, wherein the first opening is either hollow or filled with optical transmitting materials.

19. The circuit board structure of integrated optoelectronic components of claim 1, wherein the second opening is either hollow or filled with optical transmitting materials.

* * * * *